United States Patent [19]

McGinty et al.

[11] Patent Number: 5,107,426
[45] Date of Patent: Apr. 21, 1992

[54] INJECTION AND IGNITION SYSTEM TESTER

[75] Inventors: Gerard S. McGinty, Bradbury; Peter F. Schoenfeld, South Camden; Mark F. Farenden, Cecil Park, all of Australia

[73] Assignee: Ferocem Pty. Limited, Ingleburn, Australia

[21] Appl. No.: 362,824

[22] Filed: Jun. 6, 1989

[30] Foreign Application Priority Data

Jun. 6, 1988 [AU] Australia ................. PI8641

[51] Int. Cl.⁵ .......................... G01M 15/00
[52] U.S. Cl. .................. 364/424.03; 364/431.04; 364/551.01
[58] Field of Search .......... 364/431.01, 424.03, 364/551.01, 482, 483, 484, 486, 487, 431.03, 431.04; 73/116, 117.2, 117.3, 119 R, 119 A

[56] References Cited

U.S. PATENT DOCUMENTS

| 4,125,894 | 11/1978 | Cashel et al. | 73/117.2 |
| 4,378,695 | 4/1983 | Oshizawa | 73/117.3 |
| 4,527,424 | 7/1985 | Takahashi | 73/119 A |
| 4,527,531 | 7/1985 | Koyanagi et al. | 73/119 A |
| 4,694,408 | 9/1987 | Zaleski | 364/551.01 |
| 4,924,391 | 5/1990 | Hirano et al. | 73/117.3 |

FOREIGN PATENT DOCUMENTS

| 1540262 | 2/1979 | United Kingdom . |
| 2013059 | 8/1979 | United Kingdom . |
| 2127157 | 4/1984 | United Kingdom . |

Primary Examiner—Salvatore Cangialosi
Attorney, Agent, or Firm—Ladas & Parry

[57] ABSTRACT

An apparatus for in-vehicle testing of electronic fuel injection systems and/or electronic ignition systems. The apparatus selectively is able to sense, at least voltage, resistance and pulse width, and is capable of processing the sensed information, selectively displaying the voltage, resistance and pulse width information on a front face of a hand-held enclosure which contains the apparatus. The apparatus also includes sensors for oxygen sensing, temperature sensing and the like, and a pulse injector. The apparatus is specifically for use in diagnosing faults in and/or maintaining vehicle injection and ignition systems in a work shop or roadside breakdown situation.

10 Claims, 15 Drawing Sheets

INJECTION AND IGNITION SYSTEM TESTER

INJECTION AND IGNITION SYSTEM TESTER

The present invention relates to a device which is suitable for performing testing functions on fuel injection systems for vehicles. In particular the present invention relates to a portable, preferably hand held, device capable of performing a multitude of functions relating to the testing of and display of test information derived from vehicle fuel injection systems and, to a limited extent, electronic ignition systems for vehicles.

PRIOR ART

Typical electronic fuel injection systems for cars, with reference to FIG. 1, comprise a set of solenoid operated fuel injector devices 1-6-one per engine cylinder. An electronic fuel injection control unit 7 supplies electrical pulses to each injector via dedicated control cables 8-13. A typical firing waveform is shown in the inset in FIG. 1. An injector is rendered operable by an active pull-down system as shown in an indicative, schematic arrangement in FIG. 1. The electronic fuel injection unit 7 determines the number of pulses per unit time per injector and the width of each of those pulses by reference to a plurality of sensor inputs. These sensor inputs include, typically as a minimum, vehicle RPM, engine coolant temperature and cylinder air demand. Additional typical sensor inputs include vehicle exhaust oxygen content and information relating to accelerator pedal position and/or gear box transmission status.

These electronic fuel injection systems are relatively complex and are becoming more so with each new vehicle model. There is presently an unsatisfied demand for a convenient, relatively simple test device which will help the average vehicle technician charged with diagnosing vehicle faults and/or maintaining vehicle injection and ignition systems in a workshop or road side breakdown situation.

It is an object of this invention to provide a convenient, portable, preferably hand held, diagnostic tool which goes at least some way towards providing such a device.

BRIEF DESCRIPTION OF THE INVENTION

Accordingly, in one broad form of the invention there is provided an apparatus for in-vehicle testing of electronic fuel injection systems and/or electronic ignition systems, said apparatus selectively sensing voltage, resistance and pulse width; said apparatus processing sensed information and selectively displaying at least voltage, resistance and pulse width information thereby derived; said apparatus being entirely contained within a single, hand-held enclosure.

In accordance with a further aspect of the present invention there is provided an apparatus for in-vehicle testing of electronic fuel injection systems and/or electronic ignition systems, said apparatus comprising, in combination in a single, hand-held enclosure:

a volt meter;

an ohmmeter;

a logic power supply;

a voltage pulse train generator which simulates and substitutes for typical pulse trains supplied to electronic ignition modules, said voltage pulse generator producing pulses whose width and repetition rate is user adjustable;

a user selectable in steps variable impedance/voltage source which acts as a substitute for commercially available in-vehicle exhaust oxygen sensors, engine coolant temperature sensors and the like;

a voltage pulse width timer adapted to time voltage pulse width of said typical pulse trains supplied to vehicle engine fuel injectors;

alphanumeric display means for displaying parameters including ohms, volts and time measured by or influenced by said apparatus;

and bar graph display means for displaying in bar graph form timing information, said timing information including information derived from said voltage pulse width timer.

Preferably said logic supply supplies a voltage of five volts.

Preferably said voltage pulse train generator supplies voltage pulses having a repetition rate in the range 1500 to 6000 pulses per minute.

Preferably said voltage pulse width timer is adapted to measure voltage pulse widths in the range 0-20 milliseconds.

Preferably said variable voltage source is adapted to provide substitution for in-vehicle exhaust oxygen sensors having a voltage in the range 0.15 volts to 0.95 volts.

Preferably said variable impedance includes impedances adapted to substitute for engine coolant temperature sensors having impedances in the range 270 ohms-39000 ohms.

Preferably said apparatus also includes an on-board regulator adapted to receive an external 12 volts input from a vehicle battery and supply a regulated output therefrom.

Preferably said volt meter and said ohm meter include an auto-ranging capability.

Preferably said apparatus incorporates a single "common" terminal common to all measurement functions.

Preferably said apparatus is adapted to receive signals from and supply test signals to injection systems and/or electronic ignition systems under test by means of a hand held probe connected to one of only a small number of test sockets on said apparatus.

BRIEF DESCRIPTION OF THE DRAWINGS

A preferred embodiment of the invention will now be described with reference to the drawings wherein.

DETAILED DESCRIPTION OF EMBODIMENTS

In general terms, as described in the introductory portion of this specification, the first preferred embodiment of the invention is directed at a convenient, portable, preferably hand held device which combines a number of functions, which functions in combination provide a useful diagnostic tool adapted to aid the average mechanic or technician in the testing of electronic fuel injection systems for vehicles, the maintenance of such systems and the diagnosis of faults in such systems. The device of the preferred embodiment can also be used to a limited extent to test the health or otherwise of components typically found in vehicle electronic ignition systems.

Figures 1A, 1B, 1C, 1D:
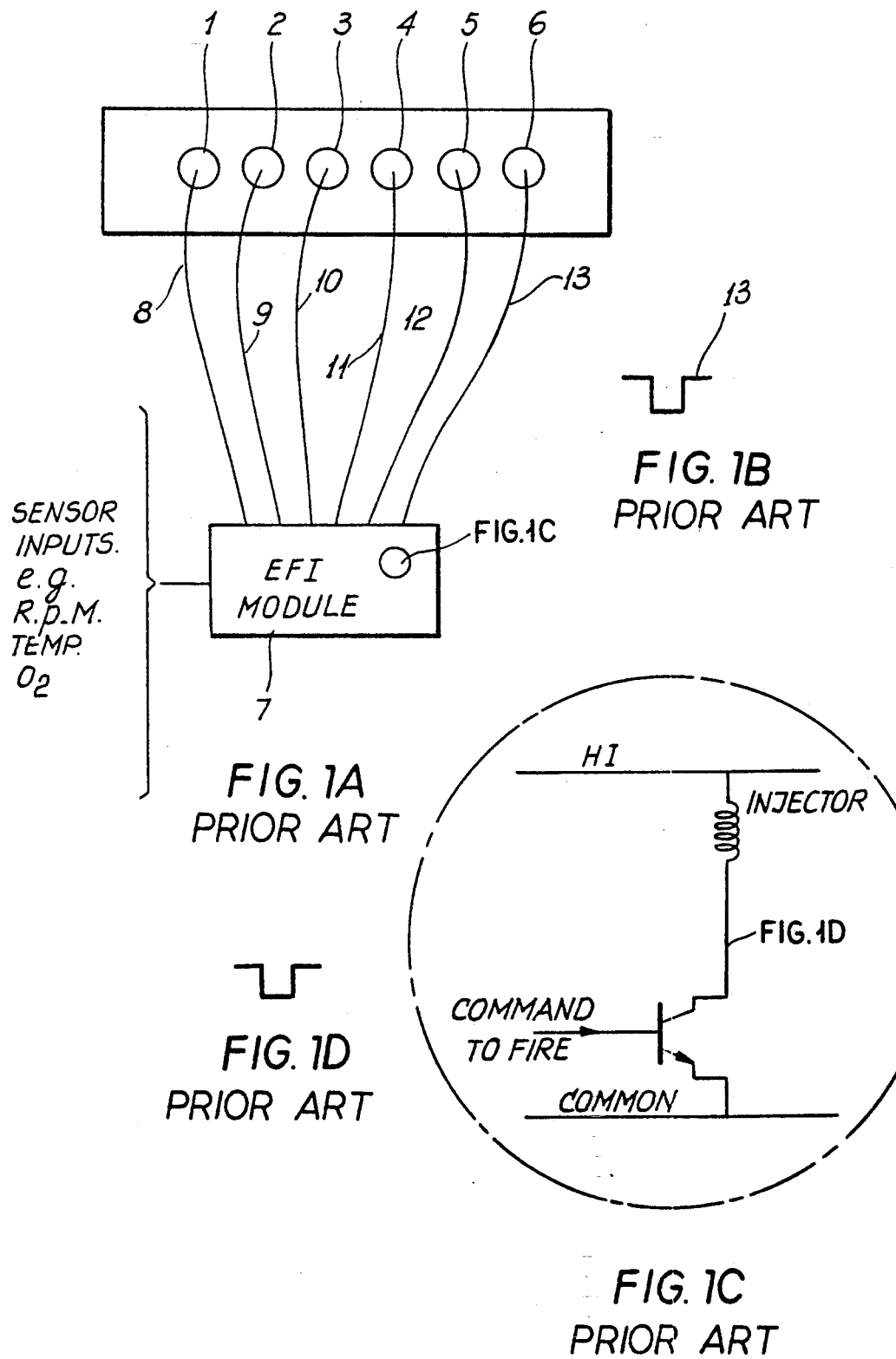
FIGS. 1A, 1B, 1C, and 1D show a typical (prior art) arrangement in schematic form of an electronic fuel injection system for a vehicle or the like, FIG. 2A, 2B, 2C, and 2D show the outer casing of an apparatus of a first embodiment.
Figure 2A:
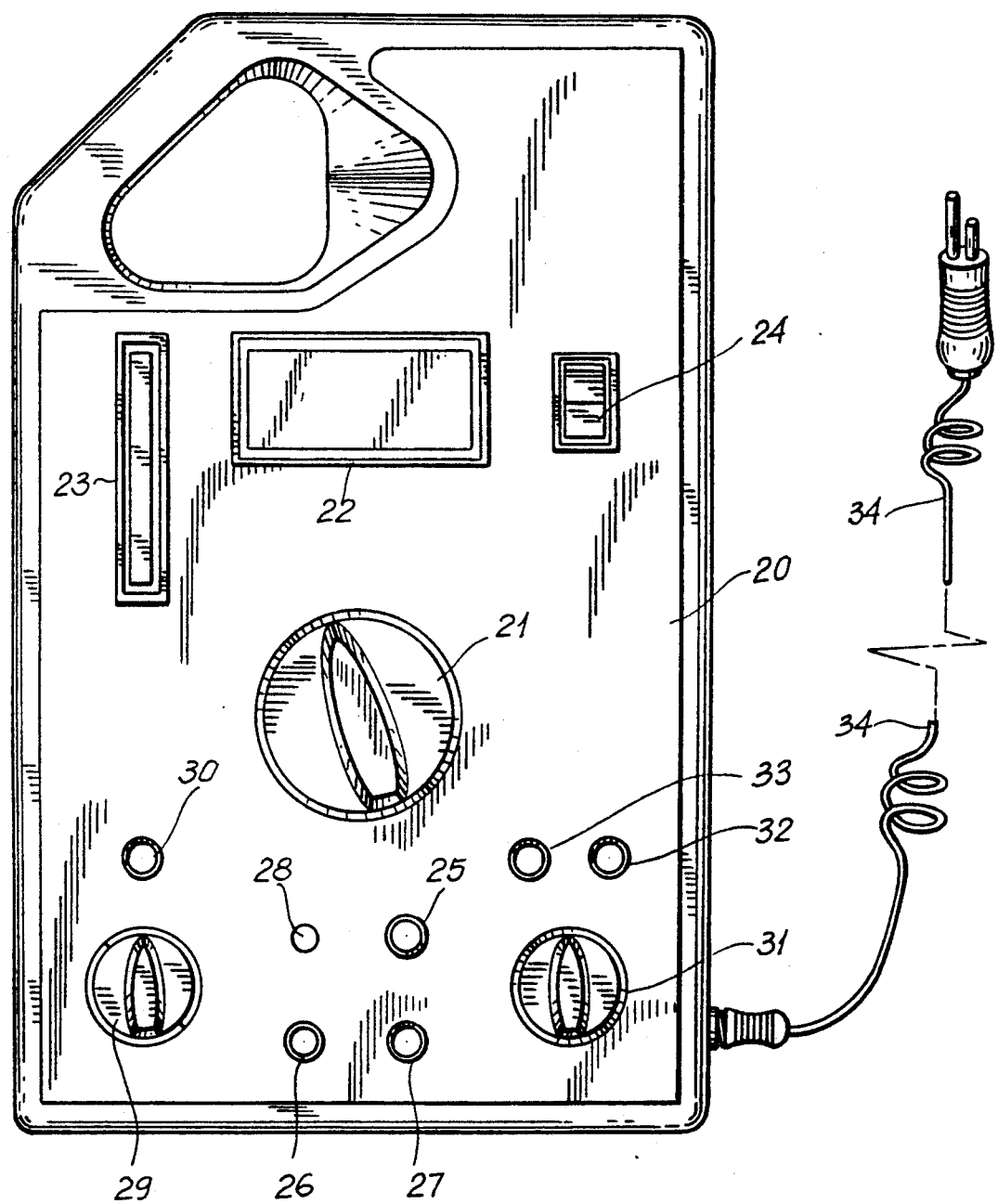
Figure 2B:
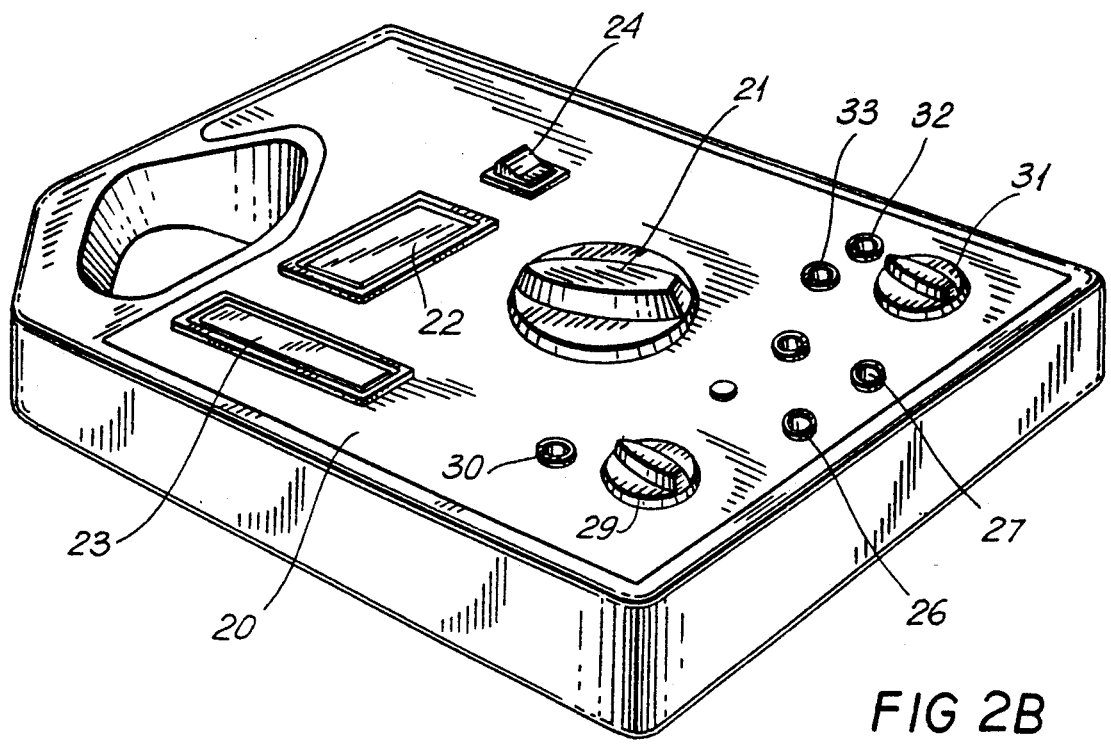
Figure 2C:
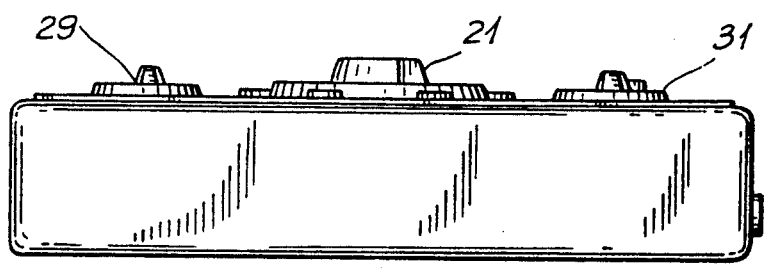
Figure 2D:
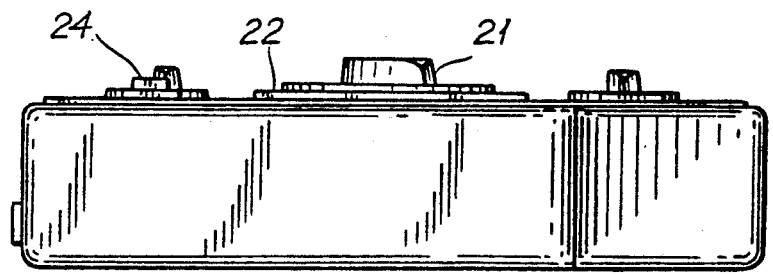

With particular reference to FIGS. 2A and 2B there is shown the external casing of the apparatus of the first embodiment. The apparatus comprises a casing 20 having on a front surface thereof a function selector 21 adapted to select one of four states: "off", "volts", "miliseconds", "ohms". Also on the front surface of the casing 20 is an alpha numeric display 22 and a bar graph display 23. A manual/auto range switch 24 allows a user to select between the manual ranging function and auto ranging function of the volt meter/ohmmeter plus enabling or disabling of the buzzer used to indicate continuity in the ohmmeter function.

Lower down on the front face of the casing 20 is a cluster of three jacks comprising a logic test supply output jack 25 a test signal output/input jack 26 a test "common" jack 27 and an external vehicle battery input is via lead 34 plus appropriate adaptors to suit source of power.

Also shown on the front face of the casing 20 is an "ignition system testing" portion comprising a potentiometric control 29 which allows the user to control the signal output from the "ignition system testing" jack 30.

Also located on the front face of said casing 20 is a "sensor simulator" portion comprising a seven position selector switch 31 for a sensor simulator. Three of the selector positions are dedicated to vehicle exhaust oxygen sensor substitution whereby the sensor simulator is connected via sensor simulator jack 33 in place of an exhaust oxygen sensor already located on the vehicle under test. The other three selector positions are dedicated to selecting engine coolant temperature substitutions to replace or substitute for the behaviour of the vehicle engine coolant temperature sensor on the vehicle under test when the sensor simulator jacks 32 and 33 is appropriately connected in place of the engine coolant temperature sensor. The seventh position is a neutral position between the two separate functions.

Figure 3A:
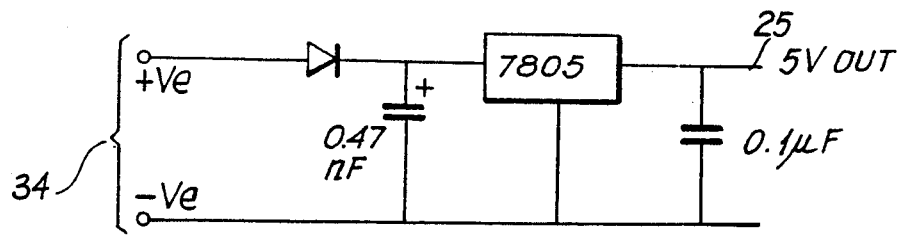
FIG. 3A shows a regulator circuit of the first embodiment adapted to supply a logic voltage output derived from a voltage source external to said apparatus of the first embodiment.

Referring to FIG. 3A there is shown the five volt logic supply which supplies a logic five volts to logic test supply output jack 25 when a twelve volt car vehicle battery is connected to the testing unit by means of external vehicle battery lead 34.

Figure 3B:
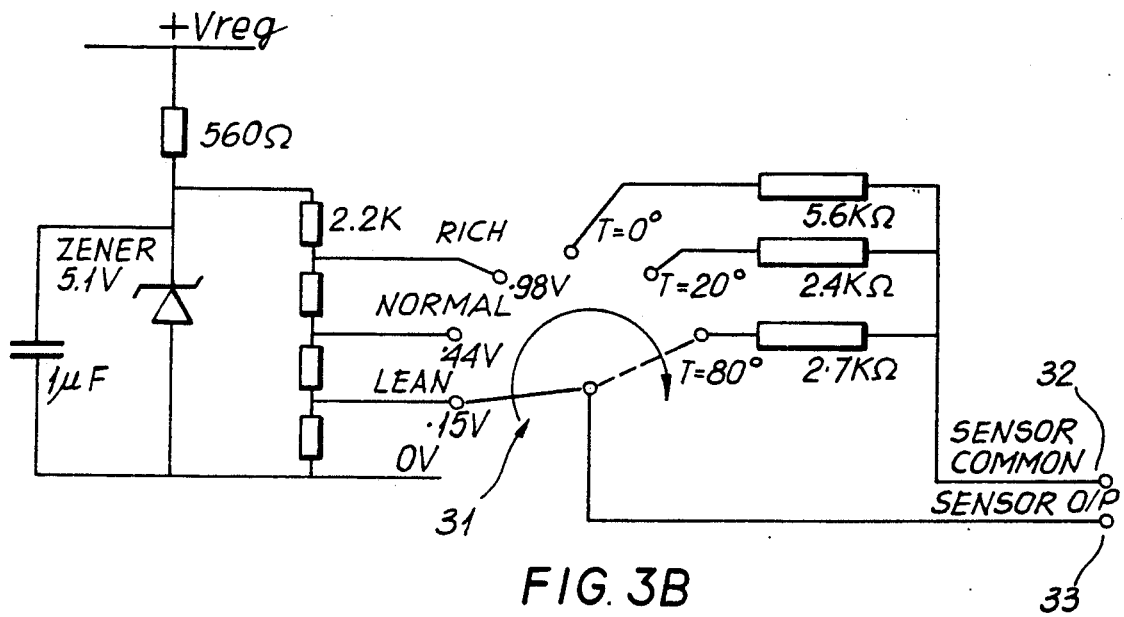
FIG. 3B shows an electronic schematic diagram of an in-vehicle exhaust oxygen sensor and engine coolant temperature sensor substitution circuit of the first embodiment.

FIG. 3B shows the sensor substitution circuit located within the casing 20. The seventh position selector switch is shown in schematic form within FIG. 3B.

Figure 3C:
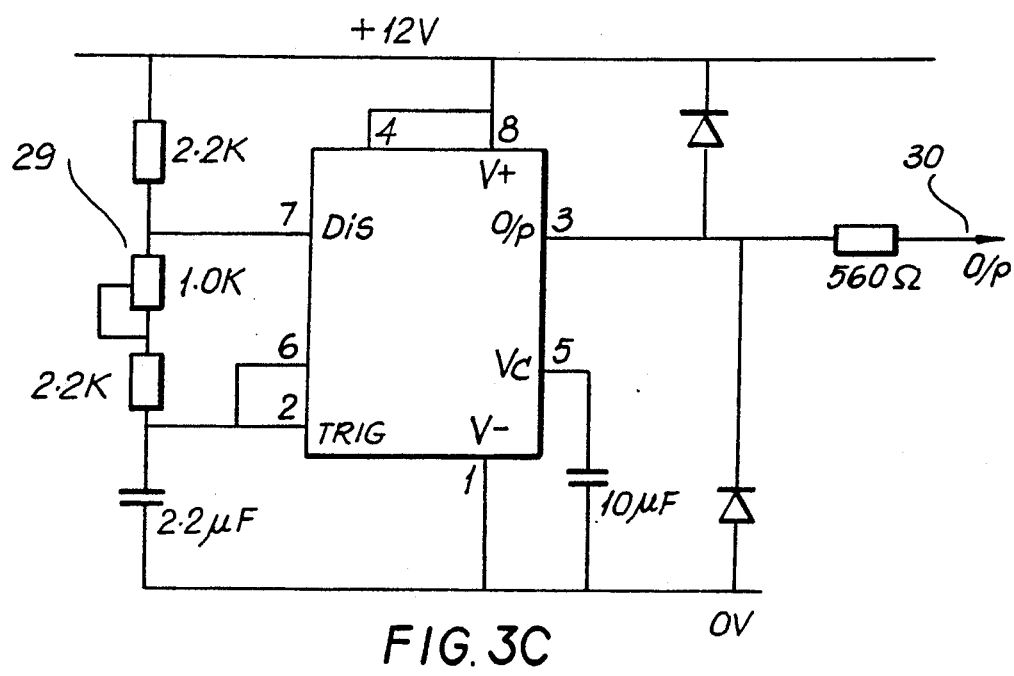
FIG. 3C shows an electronic schematic of a pulse generator circuit of a first embodiment adapted for simulating and substituting for typical pulse trains supplied to electronic ignition modules.

FIG. 3C shows the electronic circuit in schematic form which is responsible for supplying the voltage pulse train output on ignition system test jack 30. The circuit uses the commonly available "555" timer integrated circuit.

Figure 4A:
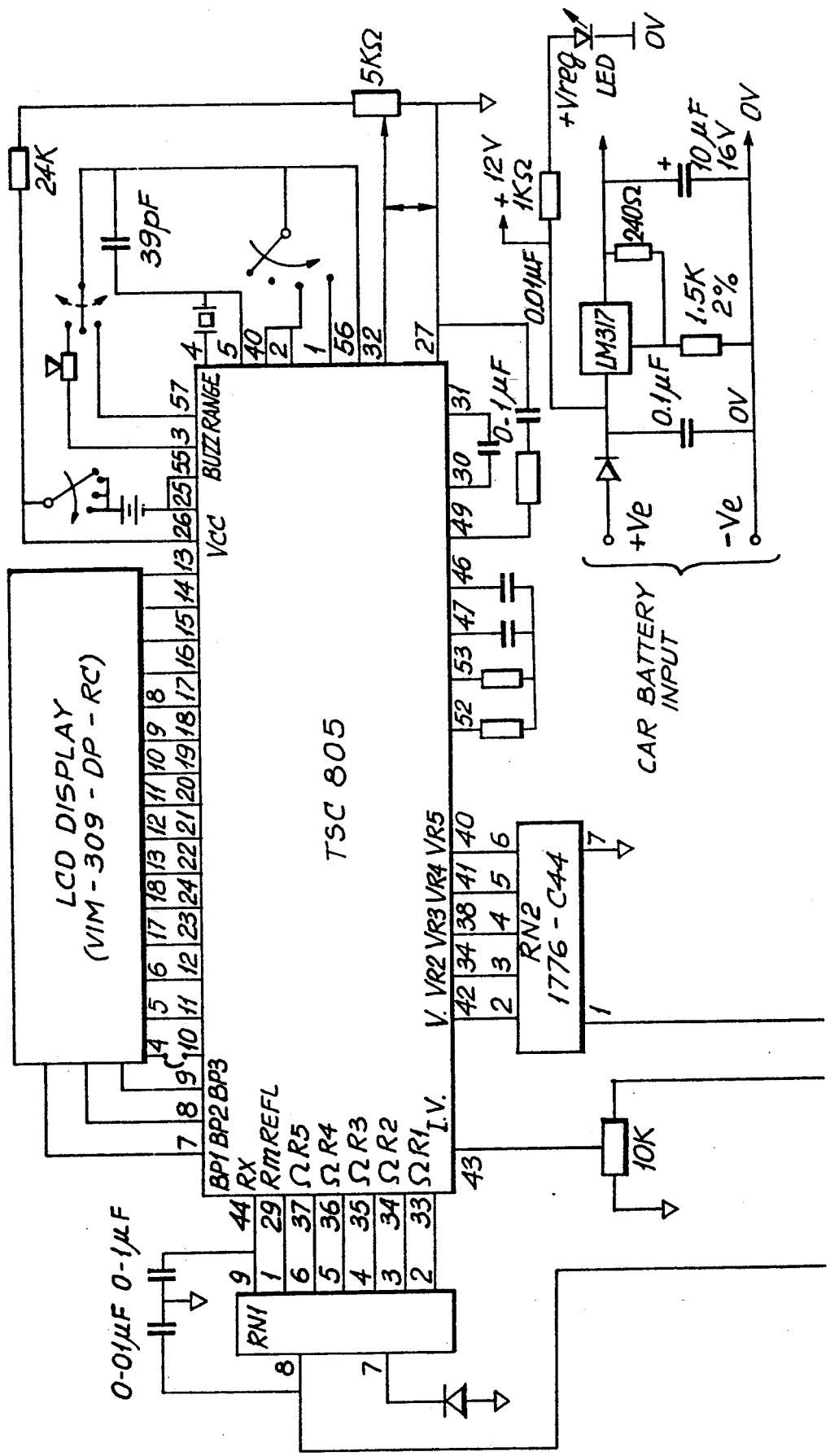
FIGS. 4A, 4B and 4C show an electronic schematic diagram of a first embodiment of the volt meter, ohmmeter and voltage pulse width timer functions.
Figure 4B:
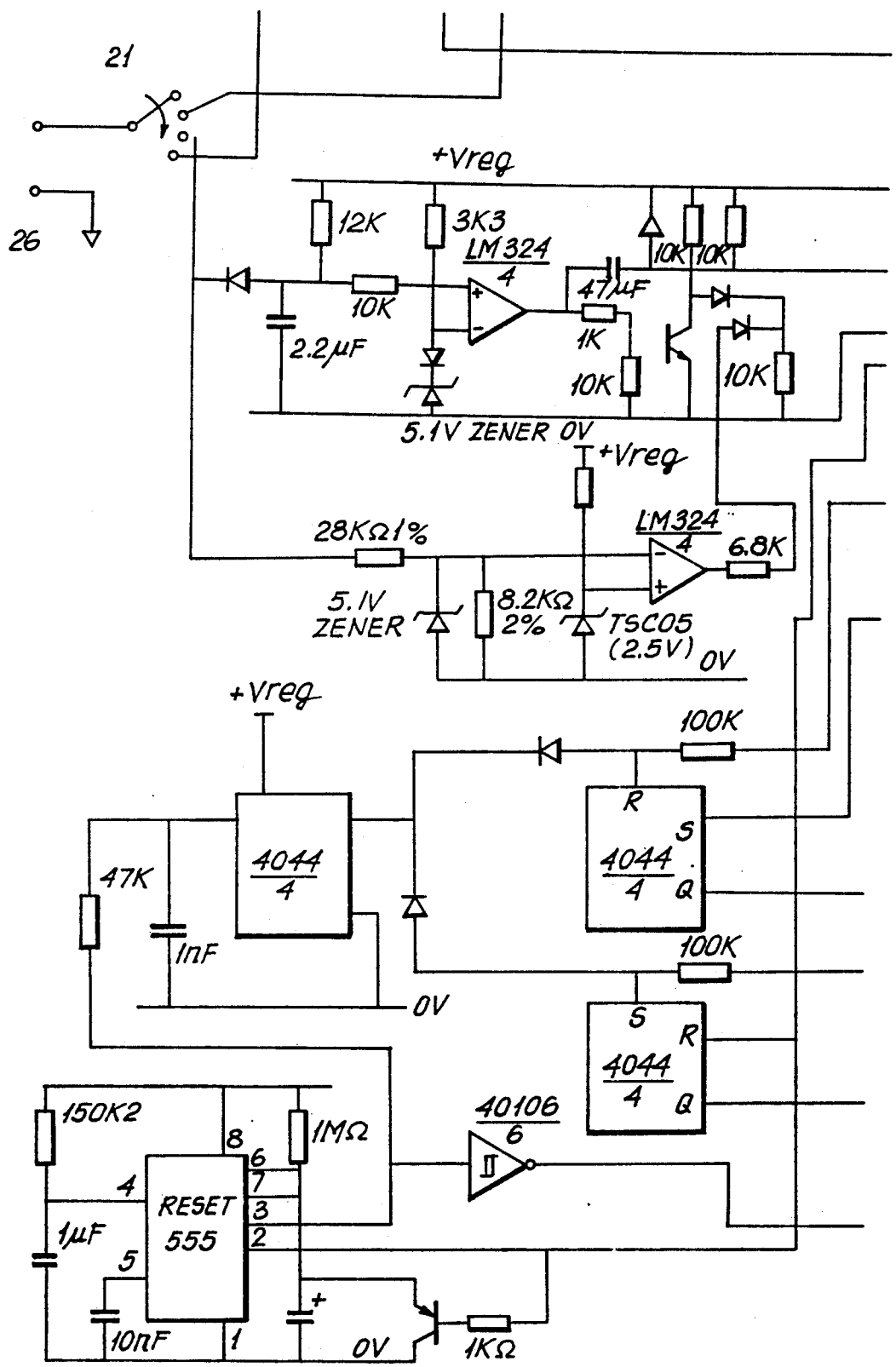
Figure 4C:
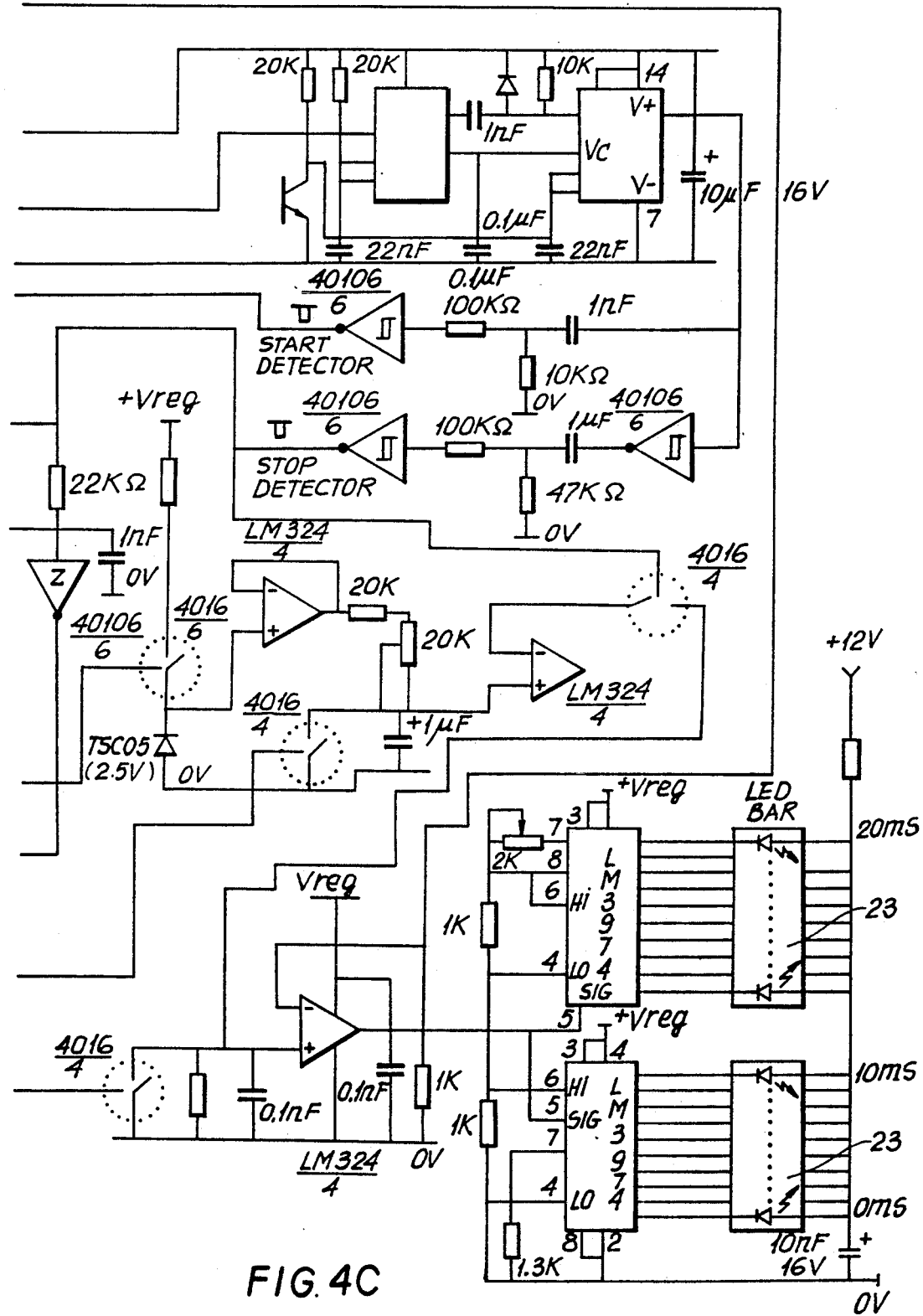

Referring to FIG. 4 there is shown the electronic circuits of the first embodiment selected by function selector switch 21. The ohmmeter and volt meter functions are based on the commercially available integrated circuit from Teledyne, the "TSC 805". In the "millisecond" position the selector switch 21 selects the circuitry which allows the bar graph display 23 to be driven so as to provide a height output proportional to the pulse width of pulses received from a vehicle under test and fed into test input jack 26. The bar graph display comprises a series of LED bars driven by the commonly available LED bar graph generator integrated circuit (in tandem) LM 3914. The circuit shown has component values chosen and is calibrated for a maximum pulse width of 20 milliseconds.

The LCD display 22 illustrated in FIG. 2A is a commercially available (from Varitronix) VIM-309-DP-RC device which, when driven by the TSC 805 chip as shown, displays numerical readings of ohms, volts, battery volts level and milliseconds.

In use, the test device of the first embodiment is taken to the location of a vehicle which requires its electronic fuel injection system and/or electronic ignition system to be tested (either for maintenance purposes or specifically for faults).

Figure 5:
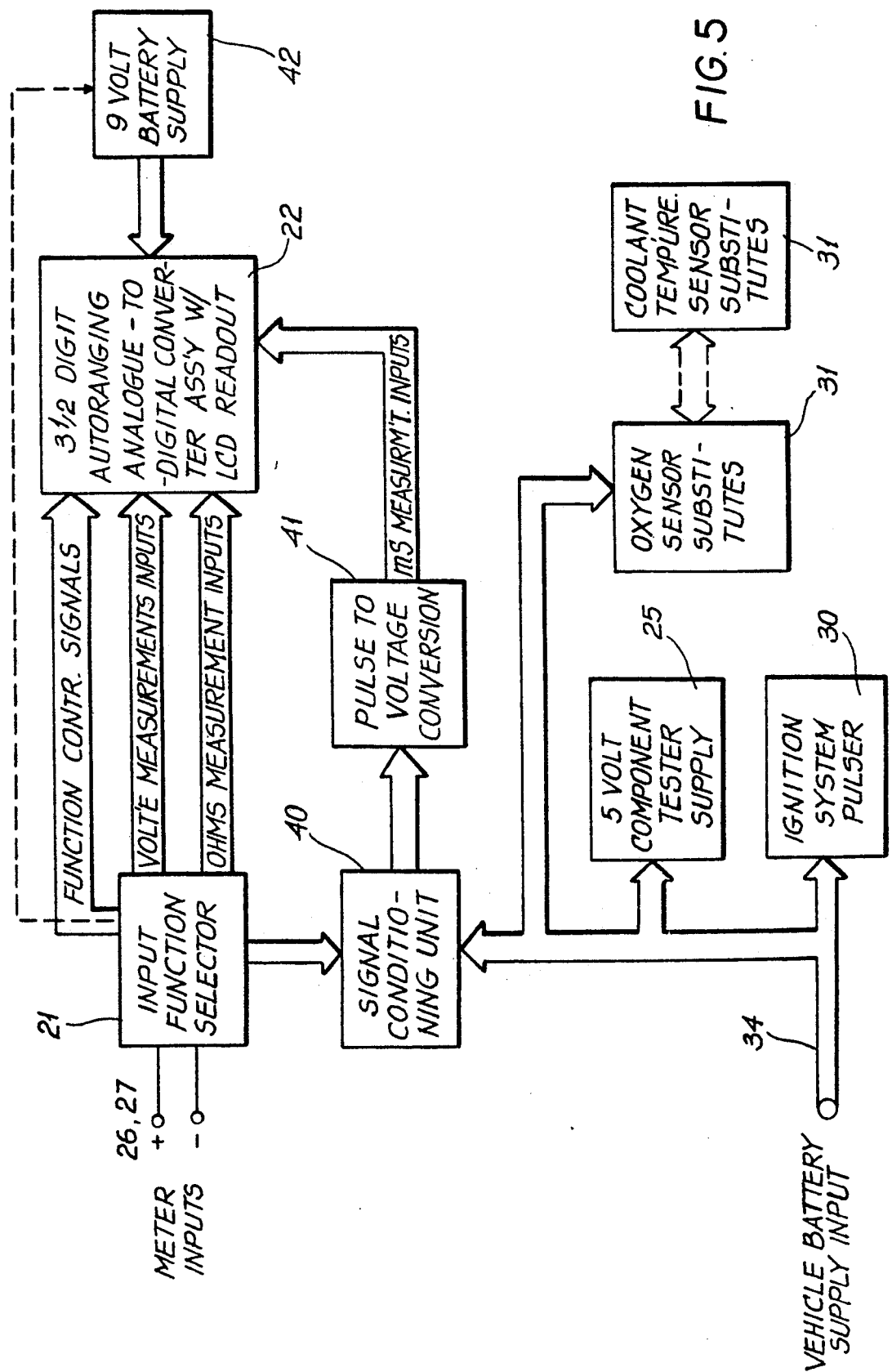
FIG. 5 shows a block diagram of the functional layout of first and second embodiments of the invention, FIGS. 6A, 6B, 6C, 6D and 6E and FIGS. 7 and 8 together show an electronic circuit diagram of a second embodiment of the invention, which embodiment is the best method of performing the invention known to the applicant.
Figure 6A:
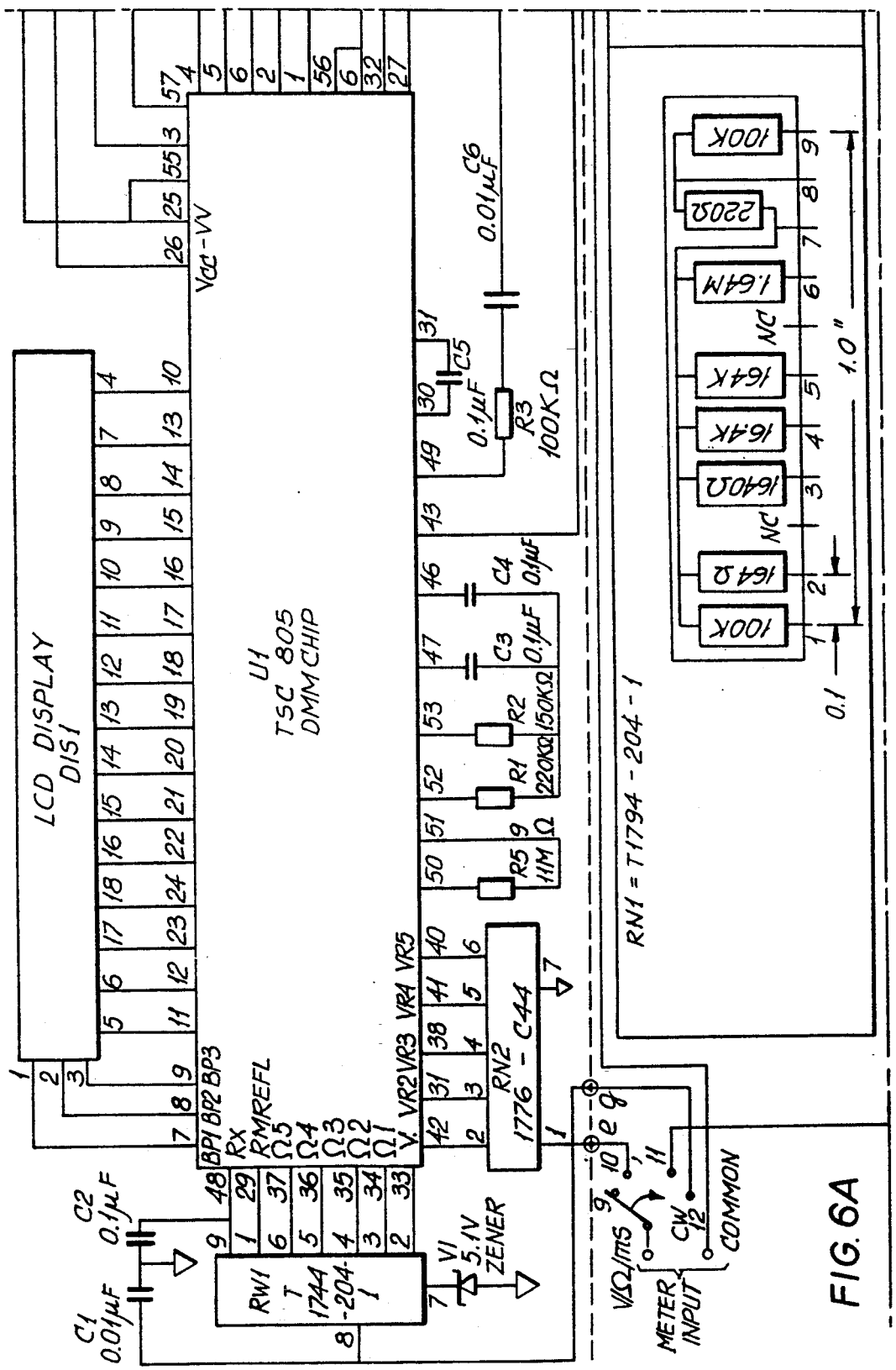
Figure 6B:
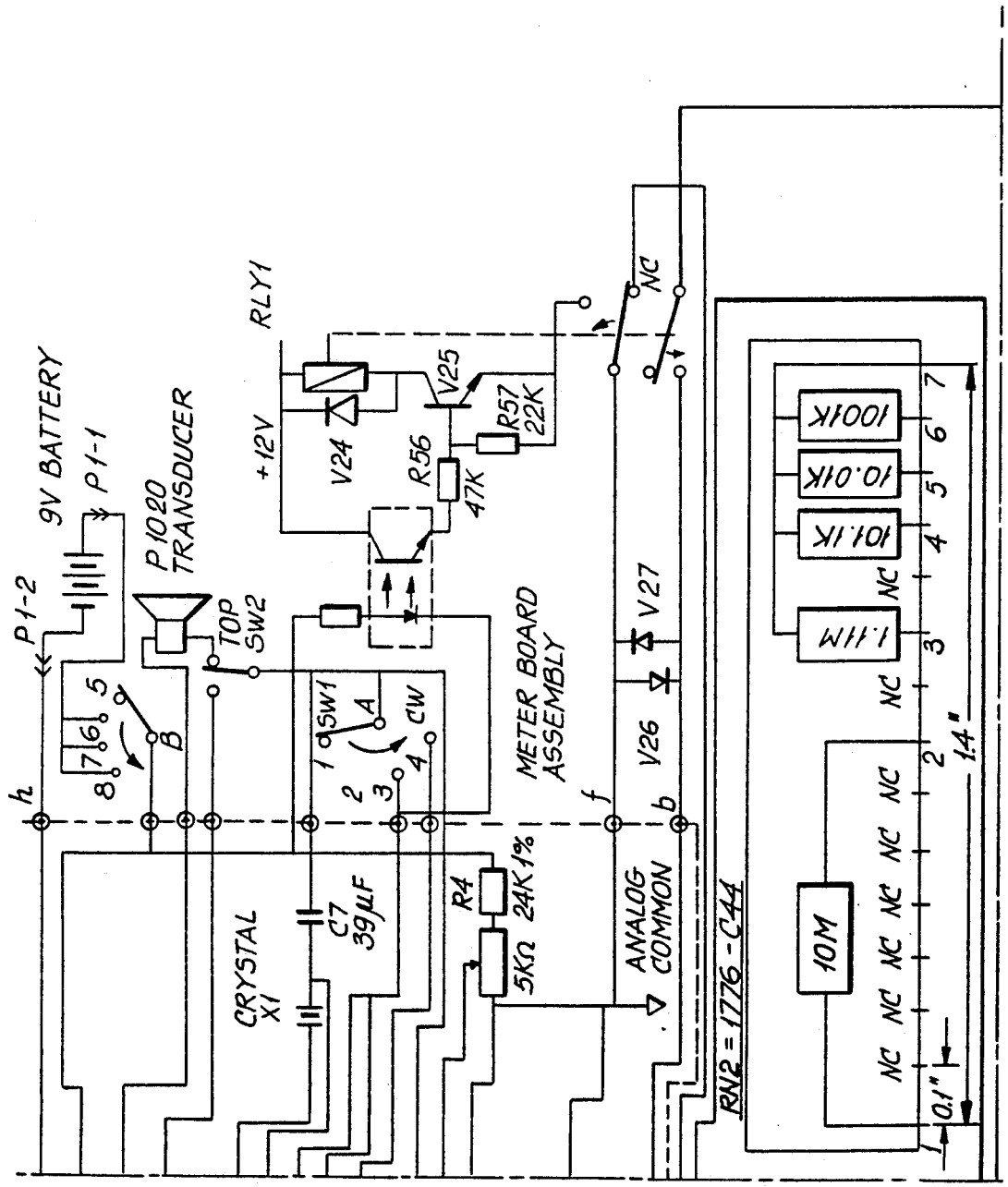
Figure 6C:
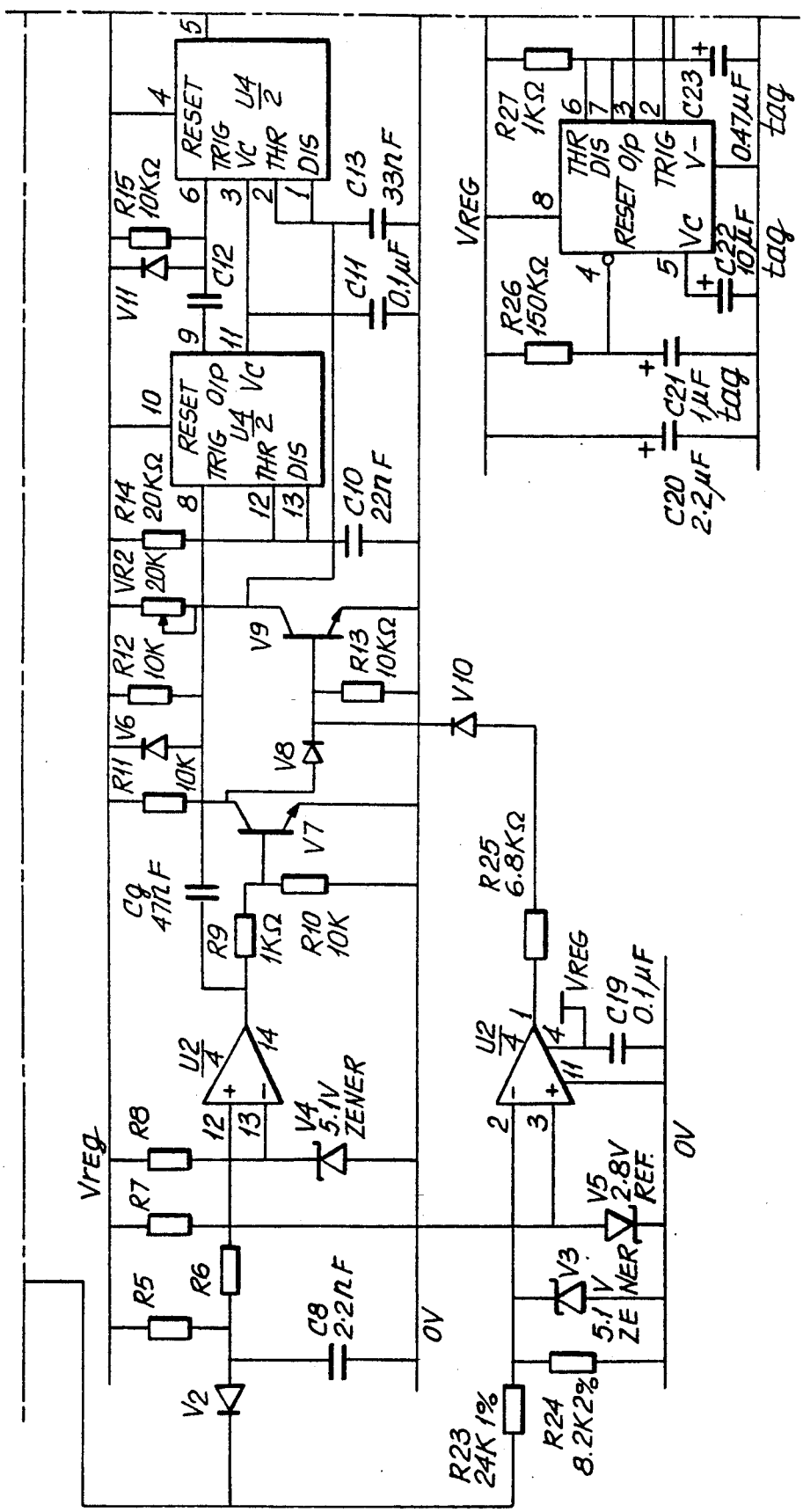
Figure 6D:
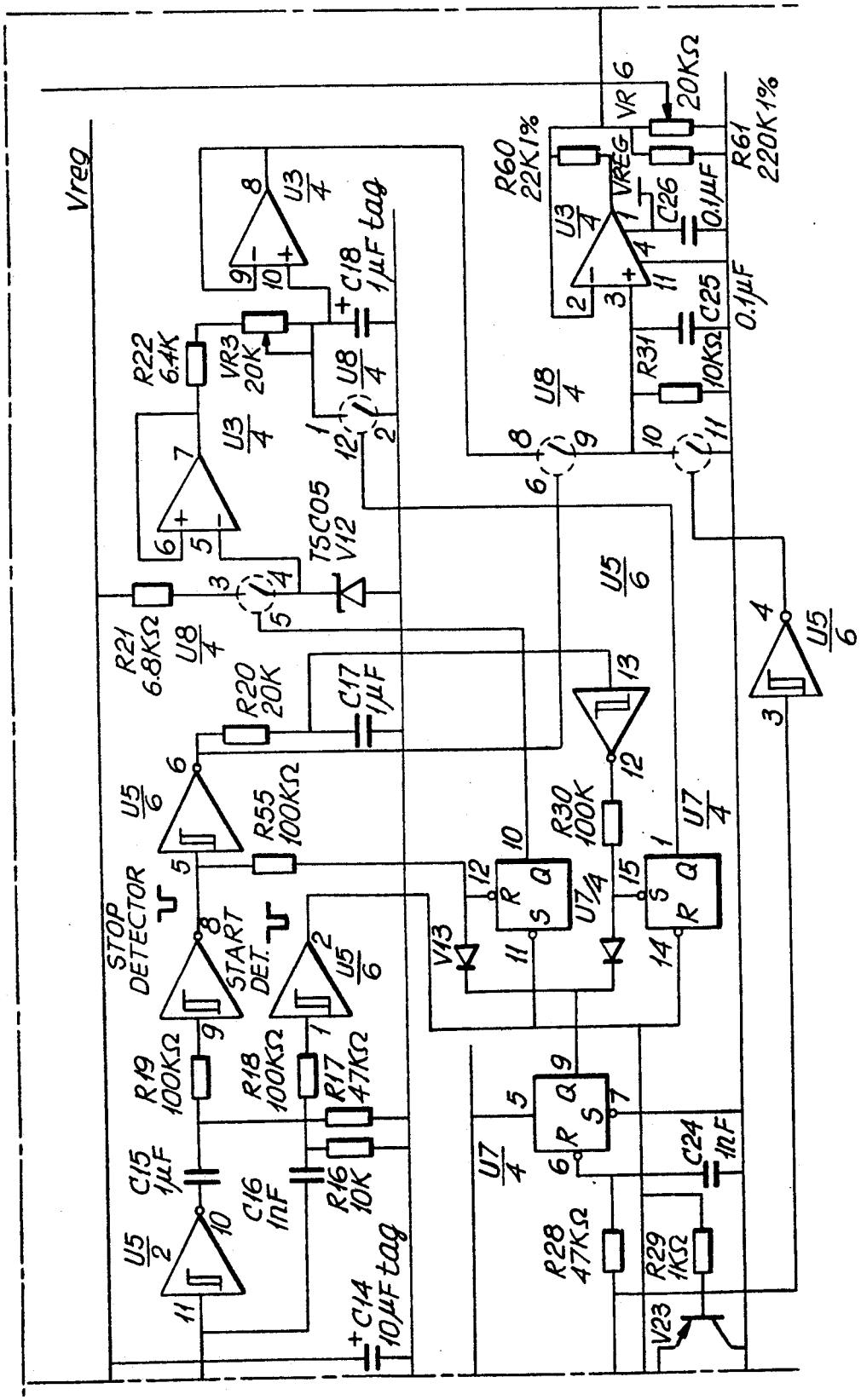
Figure 6E:
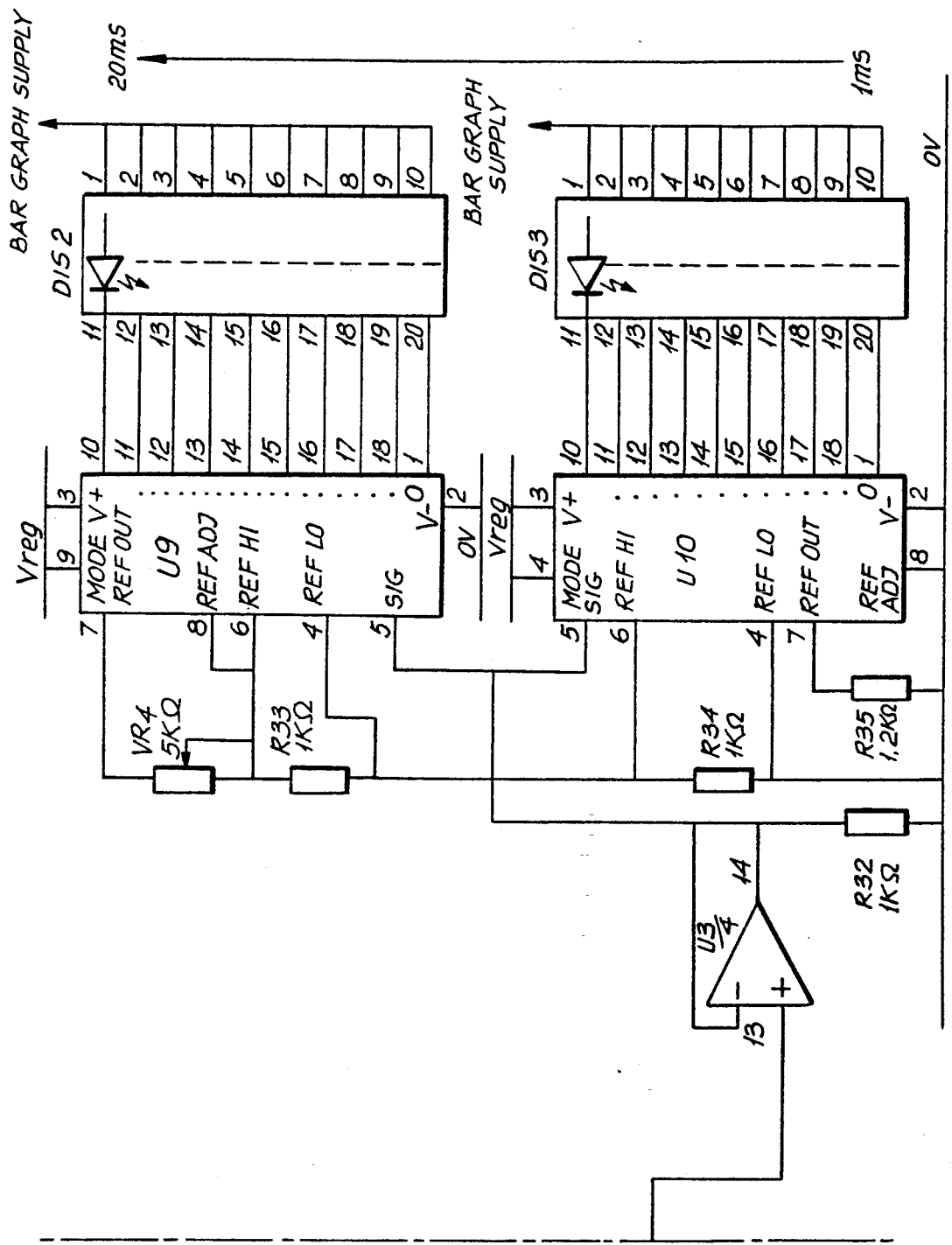
Figure 7:
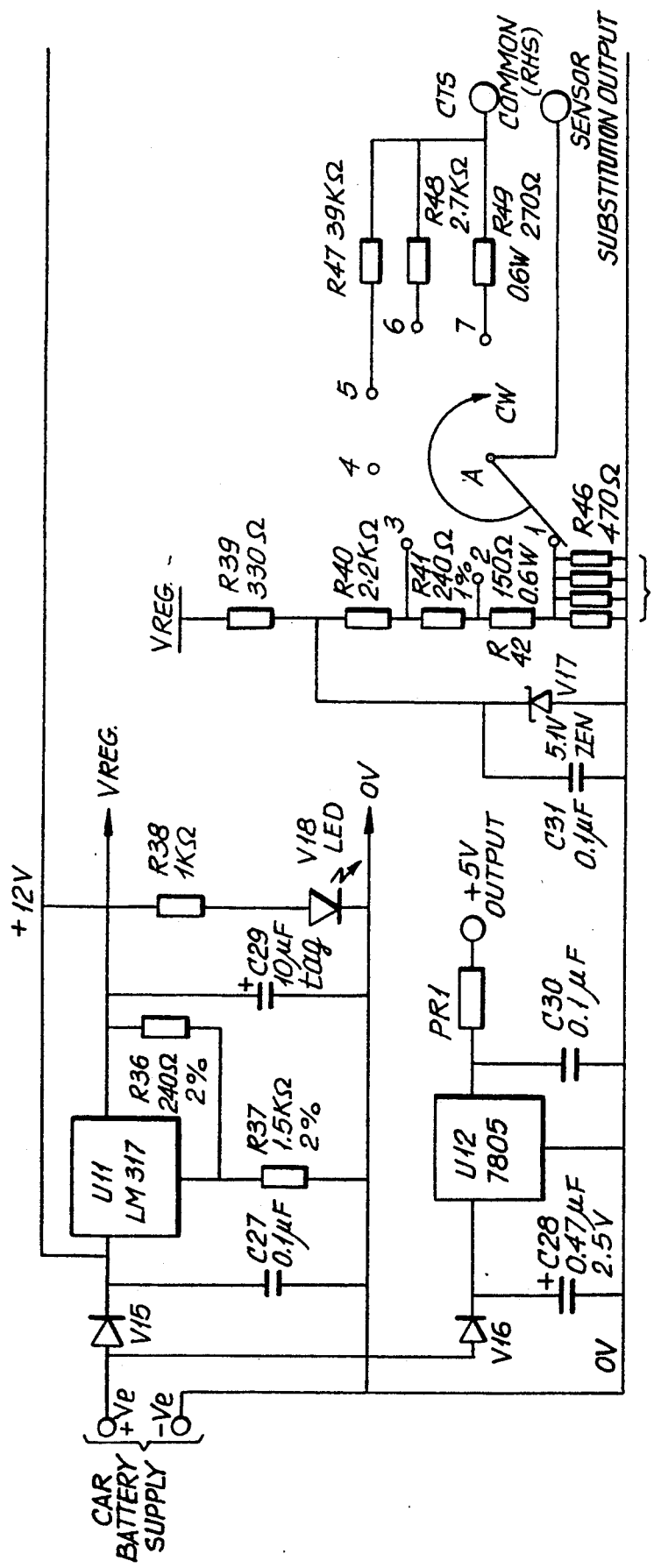
Figure 8:
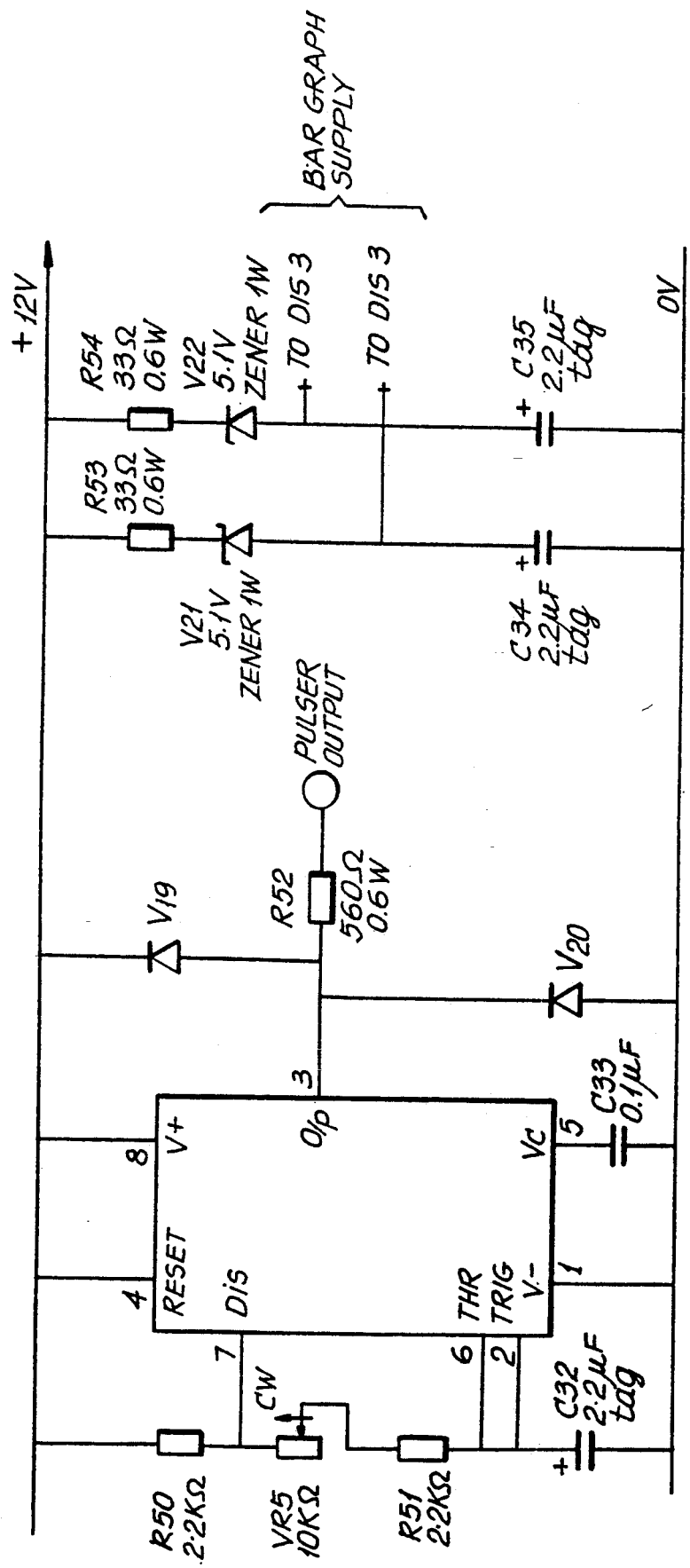

On site the mechanic/technician can perform any one or more of the following tests either alone or in combination using the device of the first embodiment:

FIG. 5 shows a general block diagram applicable to both the first and second embodiments of the invention. As generally shown therein an input/function selector 21 receives input from meter inputs 26, 27. Some inputs are directed to a signal conditioning circuit 40 and thence to a pulse to voltage conversion circuit 41 and thence to the LCD display 22. Others of the inputs 26, 27 are routed directly to the LCD display 22. This part of the system is powered by a battery supply 42.

Also shown in the block diagram of FIG. 5 are inputs from a vehicle battery supply 34 (usually 12 volts) which can be measured and is also used to provide power for the ignition system pulser 30 and the 5 volt logic component tester supply 25.

Substitution inputs 31 including oxygen sensor, coolant temperature and others are supplied vehicle battery power 34 direct.

FIGS. 6A, 6B, 6C, 6D and 6E and FIGS. 7 and 8 show an electronic circuit diagram of the second embodiment (inter-connected as indicated). All resistors shown are 0.25 W with 5% tolerance unless otherwise indicated. All unspecified diodes are type 1N914 or equivalent. Meter board connections (a through k) are shown as a dot within a circle in FIGS. 6 and 7.

Table 1 below designates part numbers for certain of the components shown in FIG. 6 together with their logic power supply requirements.

TABLE 1

| REFERENCE DESIGNATION | TYPE NUMBER | +12 V | Vreg | OV |
|---|---|---|---|---|
| U2, U3 | LM324 | — | 4 | 11 |
| U9, U10 | LM3914J | — | 3 | 2 |
| U8 | 4016 | — | 14 | 7 |
| U7 | 4044 | — | 16 | 8 |
| U5 | 40106 | — | 14 | 7 |

TABLE 1-continued

| REFERENCE DESIGNATION | TYPE NUMBER | +12 V | Vreg | 0V |
|---|---|---|---|---|
| U6 | 555 | — | 8 | 1 |
| U13 | 555 | 8 | — | 1 |
| U4 | 556 | — | 14 | 7 |
| U14 | TIL116 | — | — | — |

There are only relatively minor differences between the circuit diagram of FIG. 6 and the combined circuit diagram of FIG. 3 and FIG. 4. Functionally the two embodiments behave in the same way and like components perform like functions.

The above describes only some embodiments of the present invention and modifications obvious to those skilled in the art can be made thereto without departing from the scope and spirit of the present invention.

We claim:

1. An apparatus for in-vehicle testing of electronic fuel injection systems and electronic ignition systems;
said apparatus selectively receiving voltage, resistance and pulse width;
said apparatus processing received information and selectively displaying at least voltage, resistance and pulse width information thereby derived;
said apparatus being entirely contained in a single, hand-held enclosure,
said apparatus further comprising, in combination in a single, hand-held enclosure:
a volt meter means;
an ohmmeter means;
a logic power supply;
a voltage pulse train generator which simulates and substitutes for predetermined pulse trains supplied to electronic ignition modules,
said voltage pulse generator producing pulses whose width and repetition rate is user adjustable;
a user selectable in steps variable voltage source having variable impedance which acts as a substitute for in-vehicle exhaust oxygen sensors, engine coolant temperature sensors;
a voltage pulse width timer adapted to time voltage pulse width of said predetermined pulse trains supplied to vehicle engine fuel injectors;
alphanumeric display means for displaying parameters including ohms, volts and time measured by said apparatus;
and bar graph display means for displaying in bar graph form timing information, said timing information including information derived from said voltage pulse width timer.

2. The apparatus of claim 1 wherein said logic supply supplies a voltage of five volts.

3. The apparatus of claim 2 wherein said voltage pulse train generator supplies voltage pulses having a repetition rate in the range 1500 to 6000 pulses per minute.

4. The apparatus of claim 3 wherein said voltage pulse width timer is for measuring voltage pulse widths in the range 0-20 milliseconds.

5. The apparatus of claim 4 wherein said variable voltage source is for providing substitution for in-vehicle exhaust oxygen sensors having a voltage in the range 0.15 volts to 0.95 volts.

6. The apparatus of claim 5 wherein said variable impedance includes impedances to substitute for engine coolant temperature sensors having impedances in the range 270 ohms-39000 ohms.

7. The apparatus of claim 6 wherein said apparatus also includes an on-board regulator for receiving an external 12 volts input from a vehicle battery and supply a regulated output therefrom.

8. The apparatus of claim 7 wherein said volt meter means and said ohm meter means include auto-ranging.

9. The apparatus of claim 8 wherein said apparatus incorporates a single "common" terminal common to all measurement functions.

10. The apparatus of claim 9 wherein said apparatus is for receiving signals from and supply test signals to injection systems and electronic ignition systems under test by means of a hand held probe connected to one of only a predetermined number of test sockets on said apparatus.

* * * * *